United States Patent
Aoki et al.

(10) Patent No.: US 11,862,366 B2
(45) Date of Patent: Jan. 2, 2024

(54) MAKING AN ALUMINUM NITRIDE HEATER

(71) Applicant: LEXMARK INTERNATIONAL, INC., Lexington, KY (US)

(72) Inventors: Makoto Aoki, Ishikawa (JP); Jerry Wayne Smith, Irvine, KY (US)

(73) Assignee: LEXMARK INTERNATIONAL, INC., Lexington, KY (US)

( * ) Notice: Subject to any disclaimer, the term of this patent is extended or adjusted under 35 U.S.C. 154(b) by 0 days.

(21) Appl. No.: 18/096,275

(22) Filed: Jan. 12, 2023

(65) Prior Publication Data

US 2023/0154656 A1   May 18, 2023

Related U.S. Application Data

(62) Division of application No. 16/782,287, filed on Feb. 5, 2020, now Pat. No. 11,676,746.

(51) Int. Cl.
| | |
|---|---|
| *H01C 17/30* | (2006.01) |
| *H05B 3/28* | (2006.01) |
| *G03G 15/20* | (2006.01) |
| *H05B 3/02* | (2006.01) |
| *H05B 3/12* | (2006.01) |

(52) U.S. Cl.
CPC ......... *H01C 17/30* (2013.01); *G03G 15/2039* (2013.01); *G03G 15/2057* (2013.01); *H05B 3/02* (2013.01); *H05B 3/12* (2013.01); *H05B 3/283* (2013.01); *H05B 2203/01* (2013.01); *H05B 2203/013* (2013.01); *H05B 2203/017* (2013.01); *H05B 2203/02* (2013.01); *Y10T 29/49099* (2015.01)

(58) Field of Classification Search
CPC ..... H01C 7/18; H01C 17/30; Y10T 29/49002; Y10T 29/49099; H05B 1/00; H05B 2203/01; H05B 2203/013; H05B 2203/017
USPC ........................ 29/620, 610.1, 611, 729, 825
See application file for complete search history.

(56) References Cited

U.S. PATENT DOCUMENTS

| | | | | |
|---|---|---|---|---|
| 6,228,453 | B1 * | 5/2001 | Fareed | C04B 35/62844 428/549 |
| 6,486,447 | B2 * | 11/2002 | Miyata | H05B 3/283 29/610.1 |
| 7,012,016 | B2 * | 3/2006 | Gwo | H01L 21/02502 438/603 |

* cited by examiner

*Primary Examiner* — Thiem D Phan

(57) ABSTRACT

A method of making a heater includes an aluminum nitride base having equal to or less than 1% impurities, particularly one embodiment having none of polybrominated biphenyl, polybrominated diphenyl ether, hexabromocyclododecane, polyvinyl chloride, chlorinated paraffin, phthalate, cadmium, hexavalent chromium, lead, and mercury. The base is fired in a heating unit before any layering. Thereafter, on a topside and backside of the base a conductor layer is layered and allowed to settle and dry before firing. Next, a resistive layer is layered on the base from a resistor paste such that the resistive layer connects to the conductor layer on the topside. The resistor paste is allowed to settle and dry and then the base with the conductor and resistor layers is fired. At least four layers of glass are layered next over the resistive layer, each instance thereof including layering a glass, drying the glass and firing.

8 Claims, 9 Drawing Sheets

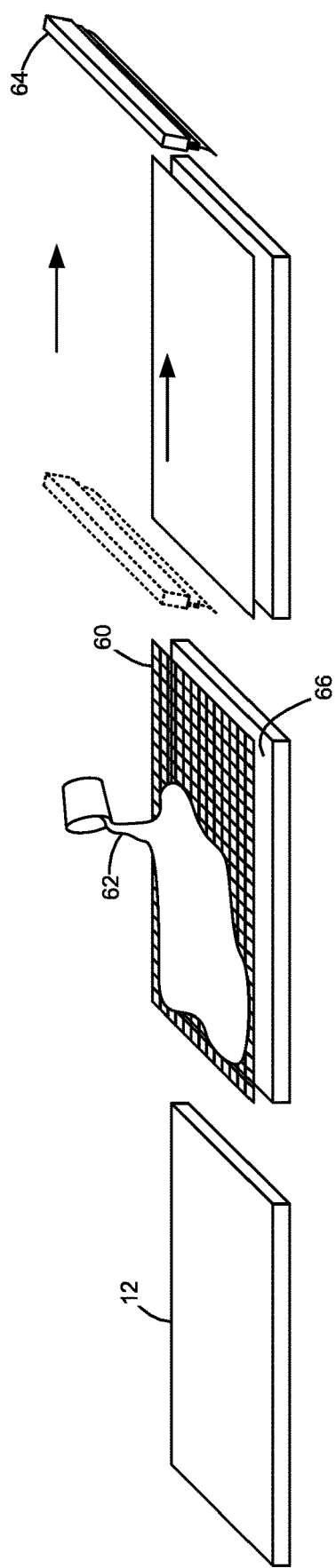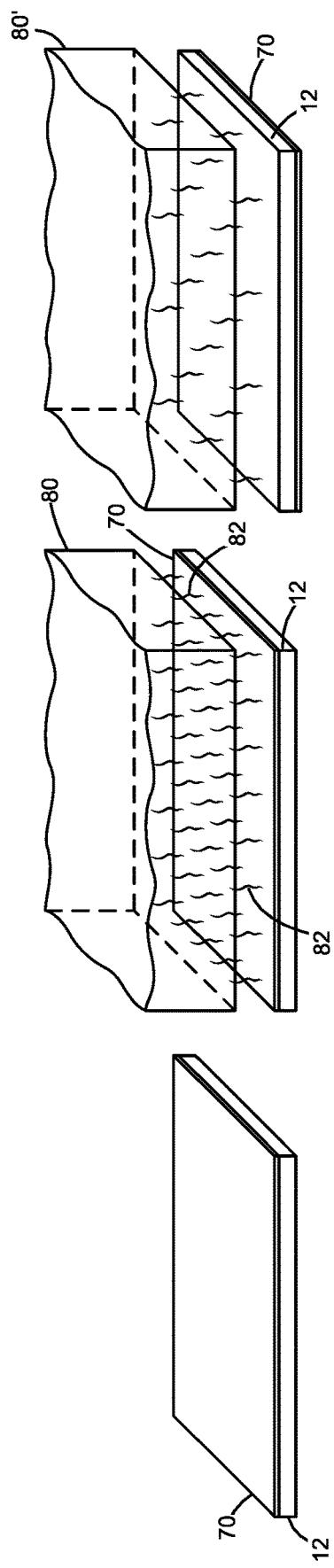

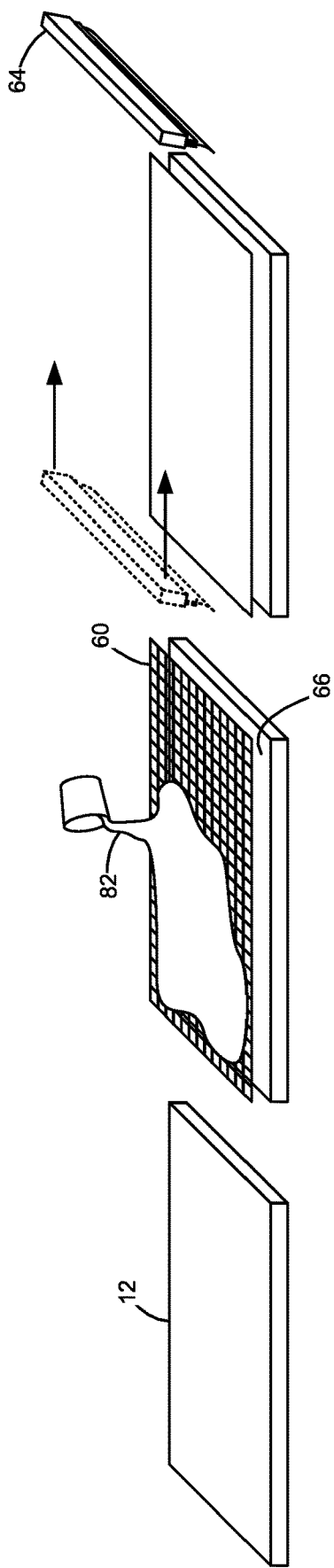
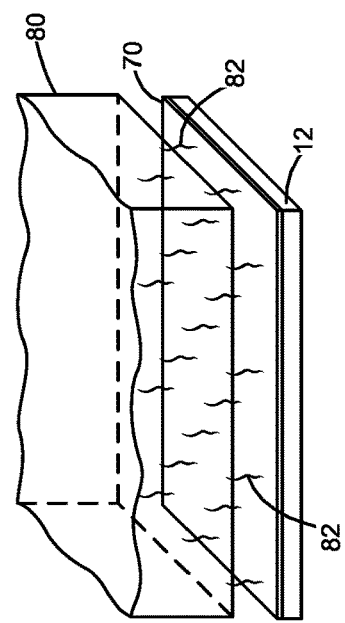

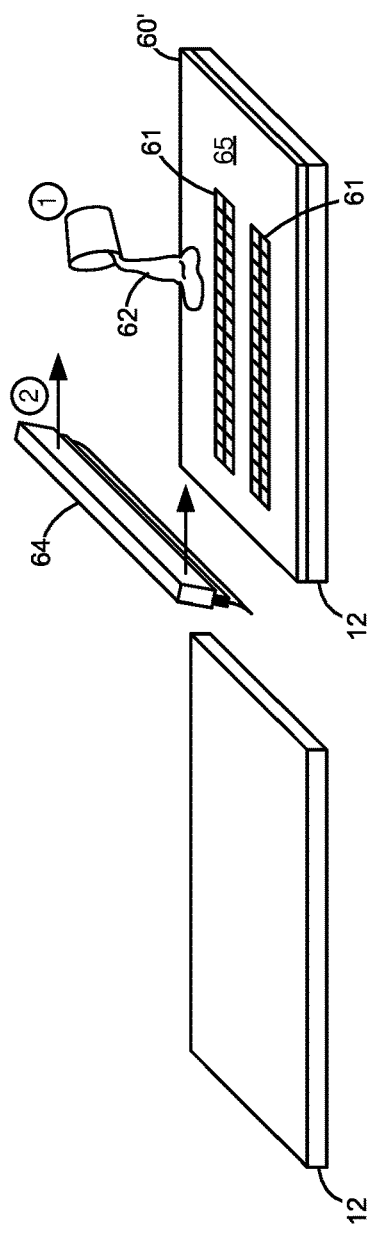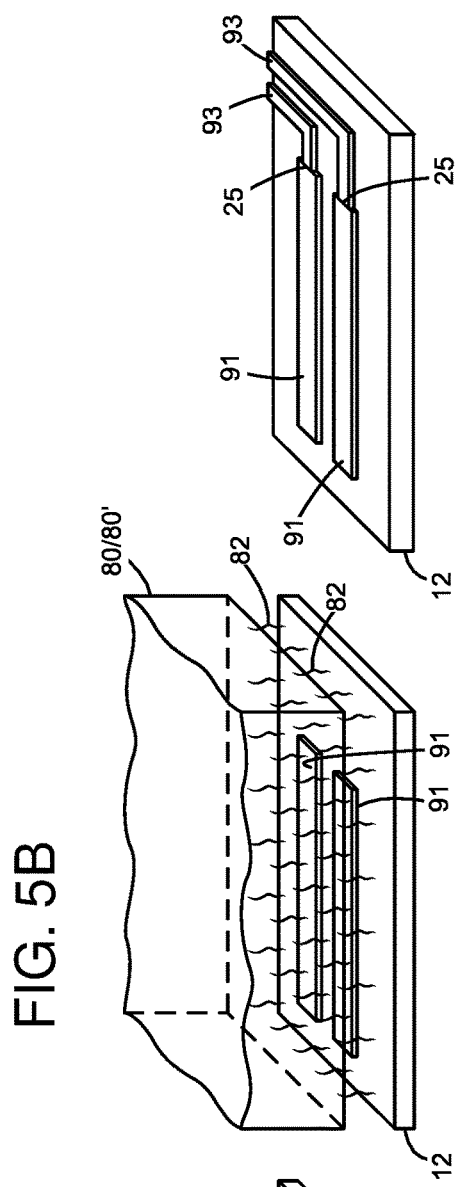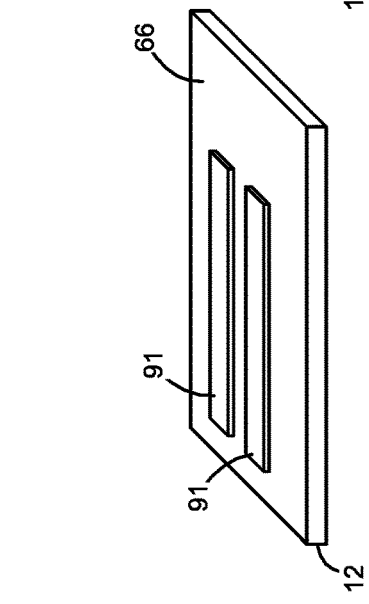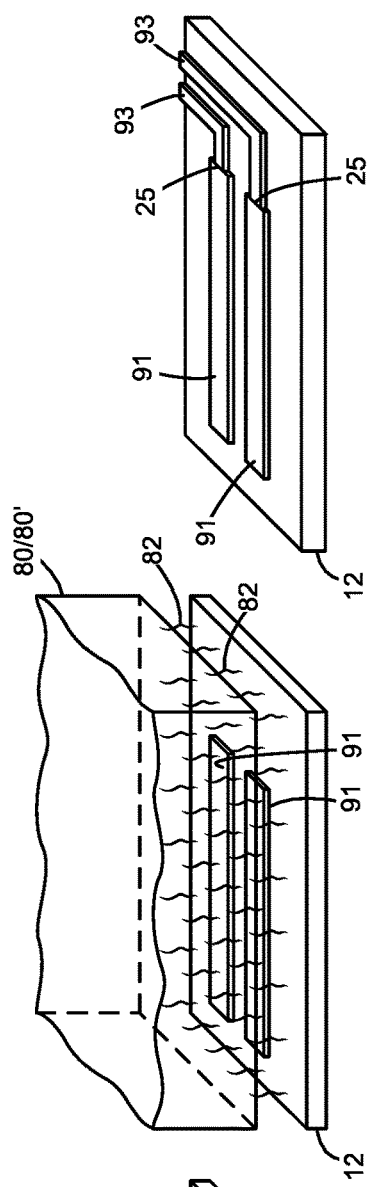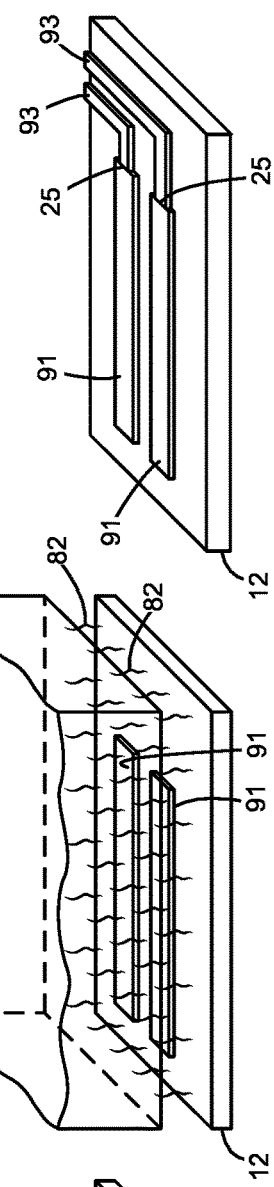

MAKING AN ALUMINUM NITRIDE HEATER

This application claims priority as a Divisional Application of U.S. application Ser. No. 16/782,287, filed Feb. 5, 2020.

FIELD OF THE INVENTION

The present disclosure relates to a heater for a variety of uses. The heater defines an essentially pure aluminum nitride base having thick film printing, including resistive and conductive layers and overlayers of glass.

BACKGROUND

Heaters have many and diverse applications in the industries of automotive vehicles, appliances, and consumer items, to name a few. They serve as cabin heaters in electric and hybrid vehicles, water heaters for dishwashers and washing machines, and sources of heat for hair dryers/straighteners, cooking apparatuses, and space heaters, etc. In imaging devices, such as printers and copiers, heaters exist in fusers to melt and fix toner on media. However, when narrow media (e.g., envelopes) are imaged, portions of the fusers extending beyond the media quickly overheat due to low thermal mass components which can become damaged. Some printers having a belt fuser heated by an aluminum oxide, thick-film printed, ceramic heater slow from 70 pages-per-minute print speed for full-sized media to 7 ppm for narrow media to prevent fuser damage by better controlling temperature, but at the expense of printing speed.

Positive Temperature Coefficient (PTC) heaters have been tested as a means of preventing damage to fusers during printing of narrow media. Some have suggested that PTC heaters are desirable for 2 main reasons: 1) PTC materials have a Curie point in a temperature region that can eliminate damage to other components, theoretically allowing narrow media to be printed at higher speeds than occurs with aluminum oxide heaters; and 2) the lower Curie point of the PTC materials serves as a safety feature. However, the inventors note that PTC materials alone are not advantageous because they have relatively low thermal conductivity. For PTC materials to be more effective, heat must be dissipated quickly from the PTC materials. Furthermore, PTC materials, when cold, have a severely low resistance—creating an extremely high in-rush current.

An aluminum nitride substrate, thick film heater, has been also mentioned for preventing damage to fusers during printing of narrow media. However, aluminum nitride heaters to date have been limited to hybrids consisting of about 80% aluminum nitride and about 20% aluminum oxide. Such materials have a thermal conductivity of about 80 W/mK compared to aluminum oxide which has a thermal conductivity of about 23 W/mK. Thus, the inventors propose an essentially pure aluminum nitride substrate, thick film heater, having a significantly higher thermal conductivity with a thermal conductivity of about 200 W/mK. No one as of yet, however, has been able to successfully thick-film print a large area resistor heater on such a substrate without Kirkendall voids (e.g., voids or gaps between the thick-film printed conductor and resistor layers on the substrate). In turn, voids such as these lead to extremely high electrical resistance causing heater failure. Furthermore, existing glass pastes cannot be used for thick-film printing di-electric glasses or cover glasses serving as electrical insulation layers over the conductor and resistor layers due to large voids in the glass. The inventors identify one reason for this as current manufacturing processes have difficulty in outgassing nitrogen gas during high temperature firing/heating (typically 850° C.) of the substrate having the conductor, resistor, and glass paste materials.

A need exists to overcome the foregoing. The inventors further note that any solutions in the technology of heaters should further contemplate the competing design constraints found in power consumption, safety features, warm-up characteristics, operating temperatures, heating speeds, thermal conductivity, materials, costs, electrical requirements, construction, materials to-be-heated, temperature control, installation/integration with other components, size, shape, and dimensions, and the like.

SUMMARY

A heater includes an aluminum nitride base having equal to or less than 1% impurities, especially none of polybrominated biphenyl (PBB), polybrominated diphenyl ether (PBDE), hexabromocyclododecane (HBCDD), polyvinyl chloride (PVC), chlorinated paraffin, phthalate, cadmium, hexavalent chromium, lead, and mercury. At least one longitudinally extending resistive trace of silver and palladium overlies the base as does a conductor of silver and platinum or silver and palladium that electrically connects to the resistive trace to apply an external voltage to the resistive trace for heating thereof. At least four, but optionally five layers of glass overlie the resistive trace and conductor, but not an entirety of the conductor. A first two consecutive layers of the glass layers define a first glass having a solid content of more than 65% and a viscosity of 100 Pa·s or less. The following two or three consecutive layers of the five layers define a second glass dissimilar to the first.

A method of making a heater includes thick film printing an aluminum nitride base having equal to or less than 1% impurities. The base is fired in a heating unit before any layering of the base. Thereafter, on a topside and backside of the base a conductor layer from a conductive paste is layered and allowed to settle and dry before firing the base having the conductor layers. Next, a resistive layer is layered on the base from a resistor paste such that the resistive layer connects to the conductor layer on the topside of the base. The resistor paste is allowed to settle and dry and then the base with the conductor and resistor layers is fired in the heating unit. At least four layers of glass are layered next over the resistive layer. Each instance thereof includes layering a glass, drying the glass and firing the base including the glass so layered. Settling, drying, and firing profiles are also noted under various embodiments.

The embodiments noted herein eliminate life-limiting Kirkendall voids in thick film printing of silver platinum (AgPt) conductors and silver palladium (AgPd) resistors at the interface of the conductor and resistor layers. The embodiments also eliminate large, prohibitive voids in layers of glass.

Further embodiments teach blends of resistor paste of about 80% silver and about 20% palladium for thick film printing on an aluminum nitride base, but still supporting a 115 volt resistor. The embodiments pioneer the use of relatively low palladium content unlike typical prior pastes of about 45% silver and 55% palladium. Pastes for conductor layers include content of about 93% silver and about 7% palladium or platinum and being essentially free of Kirkendall voids at the juncture of the resistor to conductor. The embodiments overcome problems noted with typical prior conductive pastes.

Still further embodiments note the use of a relative low firing temperature for a thick film di-electric ("cross glass") and a cover glass overlying the resistor and conductive layers. As has been practiced in the past, typical large area ceramic heaters utilized a glass firing temperature of approximately 850° C. Whereas, embodiments of the present disclosure separate the "cross glass" (higher di-electric properties) from a cover glass (lower di-electric properties but improved surface quality) and fire the cross glass at a peak temperature as low as about 835° C. while the cover glass could be fired as low as about 810° C. Without being bound by theory, the lower firing temperatures are believed to be fundamental to preventing large voids in any of the glass layers (leading to poor di-electric strength) and guaranteeing no Kirkendall voids between the resistive and conductive layers. The inventors also found the lower temperatures of firing the glass helped in two ways. First, silver migration was diminished between the silver content of each of the resistor and conductor material. Second, the oxidation of the palladium in the resistor and conductor materials was lowered in those embodiments containing palladium, where palladium oxidation and reduction rates are known to relate to Kirkendall voids.

In even further embodiments, oxidizing or plasma treating the surface of the aluminum nitride base further contributes to eliminating the deleterious effects of nitrogen out-gassing during later instances of firing the base which occurs during print, dry, and firing sequences of thick film printing.

The embodiments of the invention support many forms of heaters for use in many and diverse applications. In one design, the heater is contemplated for use as a cabin heater for Electric Vehicles (EV) and hybrid vehicles. Traditional cabin heaters today utilize a series of PTC heaters embedded in a radiator type arrangement, i.e. an array of aluminum finned heat spreaders attached to PTC heaters. Air flows through the aluminum fin heat spreaders—removing heat from the PTC. However, a major disadvantage of a PTC heater (only) arrangement is that it heats relatively slowly. Auto users complain about the relatively slow warm-up time of the PTC only cabin heaters which is attributed to a relatively high in-rush of current. Developers then must be careful not to drain the battery of the vehicle or use excessive fuel to handle the excessive in-rush current. With the embodiments of the present heater, however, the essentially pure aluminum nitride heater supports thermal conductivity of about 200 W/mK and can serve as both a pre-heater and heat spreader to the PTC heater array—eliminating any slow warm-up of cabin heaters. It also supports power designs of about 1200 Watts or more.

In other applications, an essentially pure aluminum nitride heater facilitates the printing of narrow media in an imaging device without the problems of the prior art and can bear the duties of warming up a belt and back-up roller in a belt fuser in imaging devices. Such a heater can also pre-heat a series of PTC elements and then be turned off. Heating of the PTC can commence until the in-rush current is within 10%-20%, for example, of the steady state current. Such a dual combination heating scheme allows for much quicker warm-up times.

BRIEF DESCRIPTION OF THE FIGURES

FIGS. 2A-2F are diagrammatic views of a representative sequence of printing, drying and firing layers on a substrate when forming an aluminum nitride heater;

FIGS. 3A-3E are diagrammatic views of a representative sequence of printing and drying layers on a substrate when forming an aluminum nitride heater;

FIGS. 5A-5E are diagrammatic views of a representative sequence of printing, drying and firing patterned layers on a substrate, such as resistive traces and conductors, when forming an aluminum nitride heater;

DETAILED DESCRIPTION

Figure 1A:
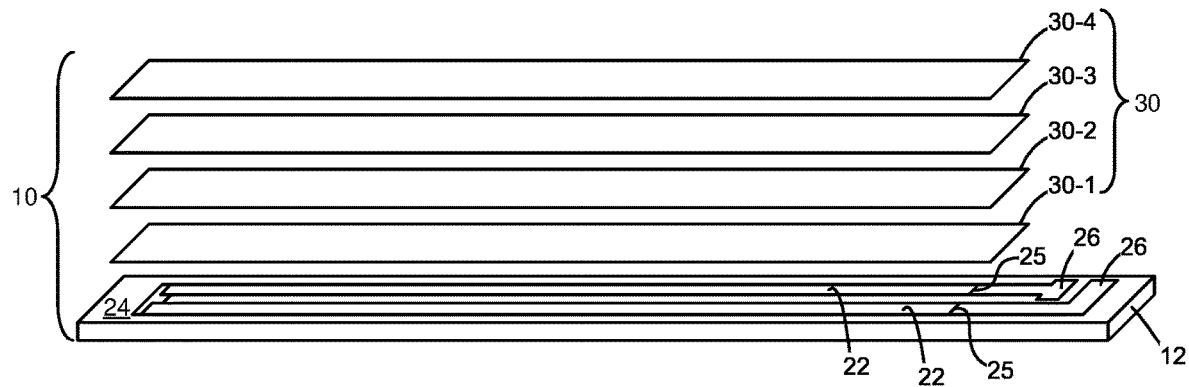
FIG. 1A is an exploded view of an aluminum nitride heater according to a representative embodiment of the present invention.
Figure 1B:
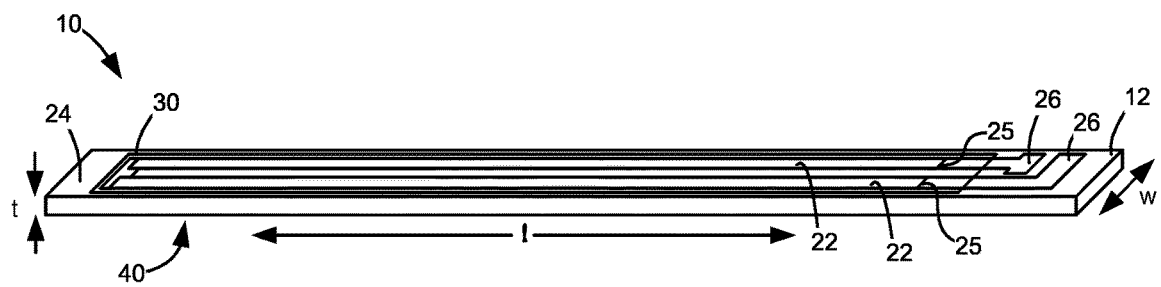
FIG. 1B is a non-exploded view of the aluminum nitride heater of FIG. 1A.
Figure 7:
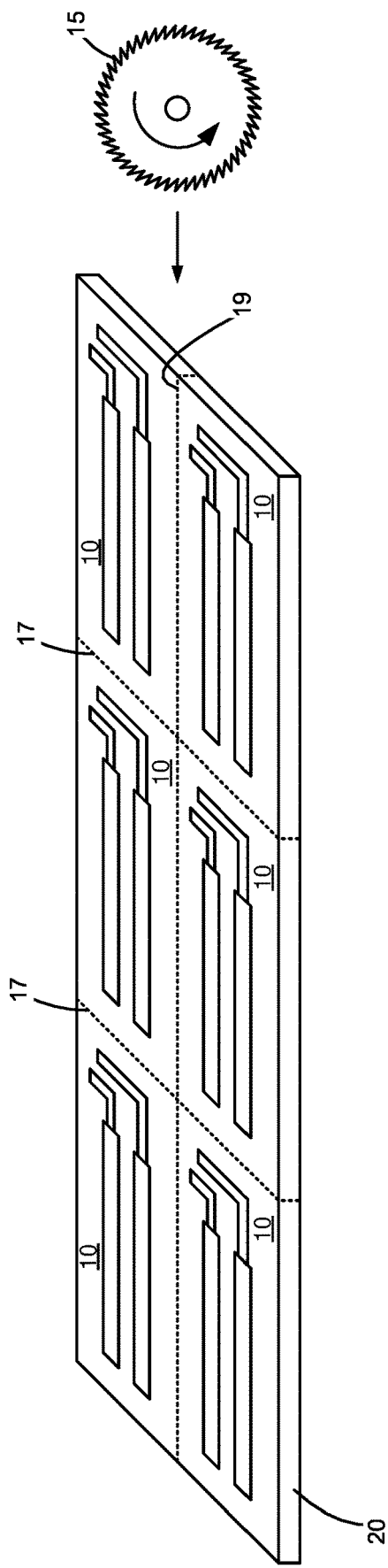
FIG. 7 is a diagrammatic view of a large substrate for dicing into plural, individual aluminum nitride heaters.

FIGS. 1A and 1B teach a heater 10 for a variety of uses. The heater includes an essentially pure aluminum nitride base or substrate 12. Essentially pure is at least 5% impurities or less, but equal to or less than 1% is preferred. In one embodiment, the impurities of the base do not include any of polybrominated biphenyl (PBB), polybrominated diphenyl ether (PBDE), hexabromocyclododecane (HBCDD), polyvinyl chloride (PVC), chlorinated paraffin, phthalate, cadmium, hexavalent chromium, lead, and mercury. The shape of the base includes a longitudinally extending solid of a generally rectangular shape having a length (l) and width (w) dimension and a thickness (t). After separating by dicing in FIG. 7 from a saw 15 along dashed lines 17 and 19 from a larger wafer 20, for example, representative dimensions of each heater 10 include a thickness in a range of about 0.5-0.7 mm, a length in a range of about 150-160 mm, and a width in a range of about 6-8 mm.

With continued reference to FIGS. 1A and 1B, each heater 10 includes at least one resistive trace 22 on a topside 24 of the base. Connected to each resistive trace at interface 25 is a conductor 26. During use, the conductor 26 receives power from an external voltage source to power the resistive trace(s) 22. In turn, the resistive trace heats and provides heating to the device in which it is used, such as for a cabin heater in an electric or hybrid vehicle or a fuser in an imaging device. In one embodiment, the external source is 115 VAC. In others, it is 12 VDC, 350 VDC, 650 VDC or 800 VDC. In any, the resistive trace and conductor support the voltage and lack Kirkendall voids at the interface 25, by way of the methods of manufacturing the heater as described below. In dimensions, the thickness of the resistive trace is about 10-13 µm on the aluminum nitride base and has a length of about 135-145 mm and a width of about 4.5-5.5 mm. The conductor has a thickness of about 9-15 µm on the aluminum nitride base, a length of about 11-13 mm, and a width of about 4.8-5.8 mm. Also, the resistive trace has a resistance of about 10-12 ohms at 195° C. The resistive trace is formed from a resistor paste of about 80% silver and 20% palladium while the conductor is formed from a conductive paste of silver and palladium or platinum. In one embodiment, pastes for conductor layers include content of about 93% silver and about 7% palladium or platinum.

Overlying each resistive trace and at least a portion of the conductor, but not an entirety of the conductor as it needs to connect to the external power source, is at least four layers of glass 30 (30-1, 30-2, 30-3, 30-4, FIG. 1*a*). The glass is any of a variety but the first two consecutive glass layers 30-1, 30-2 are of a first type, while the next two 30-3, 30-4 are of a different type. The first type defines a cross glass layer, while the different type defines a cover glass layer. Any of the four glass layers define a glass having a viscosity of 100 Pa·s or less. More particularly, the viscosity exists at 90 Pa·s or less, especially 65 Pa·s or less. Its solid content, on the other hand, exists at 65% or more. In various specific embodiments, the glass is purchased commercially from AGC, Inc. (formerly the Asahi Glass Company) as seen in Table 1. Its properties are also noted.

TABLE 1

| AGC, Inc. Glass Paste ID | Thixotropic Index | Viscosity (Pa · s) | Solid Content (%) |
| --- | --- | --- | --- |
| AP5717B10 | 2.0-2.4 | 100 | 66 |
| AP5717B13 | 1.6 | 89 | 69 |
| AP5717B14 | 1.4 | 61 | 72 |

In any layer of glass, the dimensions include a thickness in a range of about 10-13 μm on the aluminum nitride base, a length in a range of about 135-145 mm, and a width in a range of about 4.5-5.5 mm. In one embodiment, the first two consecutive layers 30-1, 30-2 of the at least four glass layers together have a thickness of about 24 μm. The next two consecutive layers 30-3, 30-4 and a fifth layer of glass (not shown until FIG. 6I) together have a combined thickness of about 65 μm. The fifth layer of glass also overlies the base and resistive and conductive layers and is similar in composition to any of the cover glass layers.

Figure 1C:
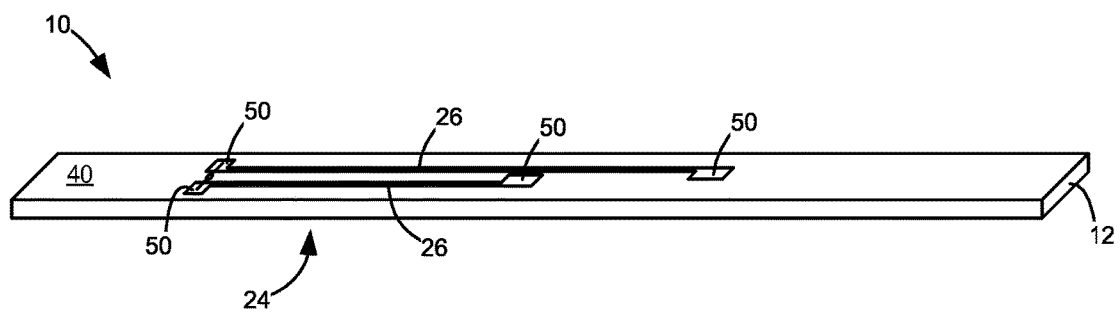
FIG. 1C is a backside view of the aluminum nitride heater of FIG. 1B.

With reference to FIG. 1C, a bottom or backside 40 of the base 12 optionally includes one or more thermistors 50. They interconnect with a same or different conductor 26 of the topside. They are positioned to measure the temperature of the heater 10 and the conductor 26 connects the thermistors to external sources to measure, store and control the temperature.

With reference to the Figure sets of 2A et seq., 3A et seq., and 4A et seq., the general process steps for fabricating the heater 10 of FIGS. 1*a* and 1*b* will be described. They include one or more of thick-film printing, settling, drying, and firing or heating. As shorthand from the industry, they are generally known as print, dry, and fire, or PDF.

In more detail, the FIGS. 2A-2F show printing, drying, and firing. In FIG. 2A, a base or substrate, such as the essentially pure aluminum nitride base 12, is provided. In FIG. 2B, thick-film printing of the substrate includes providing a mesh stencil 60 upon and through which a paste 62 is applied. In the instance of layering a resistor, conductor or glass, a resistive paste, a conductive paste or a glass paste is applied. In FIG. 2C, a leveling device 64, such as a squeegee or other scraper, levels the paste on a surface 66 (FIG. 2B) of the base. In FIG. 2D, the paste so applied is allowed to settle on the base forming a layer 70 upon removal of the stencil. This settling occurs typically for about five to ten minutes at room temperature, e.g., 20°-25° C. In FIG. 2E, the base and layer is provided to a curing or drying unit 80. The drying unit typifies a box oven or blast furnace and the base is provided to the unit along a conveyor, typically. The drying unit begins drying the layer 70 at around room temperature followed by a curing or drying cycle of about 30 minutes reaching temperatures of 140°-160° C. In one embodiment, the drying cycle includes applying infrared heat or hot air (both given generically as heat 82) for a period of time of about 30 total minutes at a temperature profile of the drying unit beginning at about 25° C. and ramping up to about 80° C. for about 10 minutes, ramping up again to about 160° C. for about minutes and cooling down to below 50° C. After that, the base 12 with layer 70 is fired in a heater or firing unit 80'. In some instances, the firing unit 80' is the same unit as the drying unit but having different heating profiles. In others, the firing unit 80' is different from the drying unit 80 and the base advances from one unit to the next along a conveyor, typically. In any, the heating profile for heating the base depends upon which type of layer is most recently printed and dried thereon, e.g., resistive layer, conductive layer or glass layer.

Figure 8:
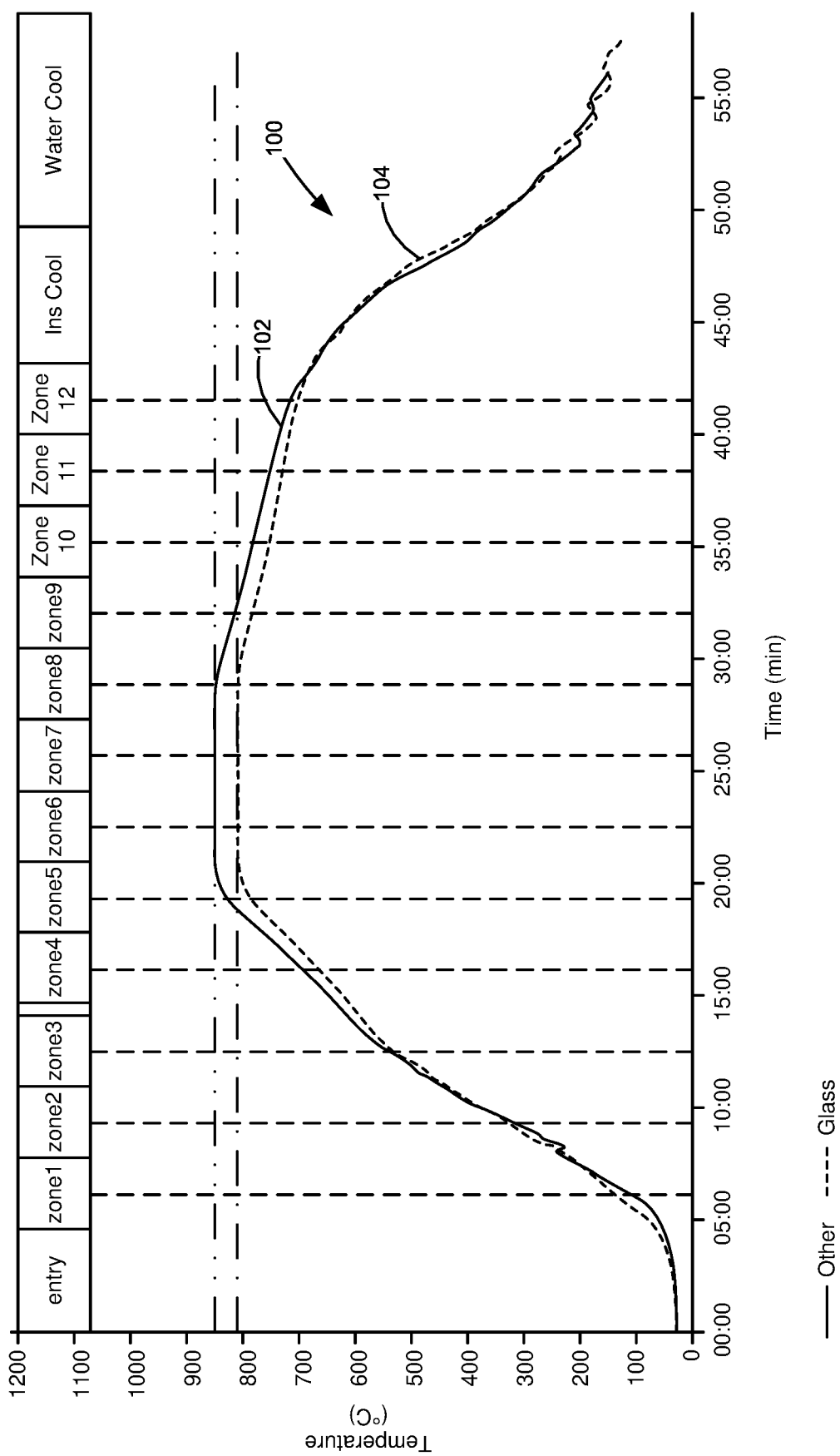
FIG. 8 is a graph of a representative heating profile according to embodiments of the invention for firing in a heating unit a base or substrate with or without overlying layers.

In FIG. 8, a representative heating profile for any layer is shown in graph 100. Namely, the heating profile for a un-layered base or resistive or conductive layer is shown by the solid line 102, whereas a dashed line 104 depicts the heating profile for glass. In general, the heating profile of the heating unit includes a total heating time of about 40 total minutes starting at about 25° C. and ramping up to a peak temperature (part of zones 5-8) by 20 minutes and maintaining the peak temperature for at least 10 minutes and decreasing the temperature of the heating unit (post zone 8) for at least 10 minutes thereafter. Cooling continues even further thereafter (post zone 12) until completely cooled. For an un-layered base or the resistive or conductive layers, the peak temperature reaches about 850° C. The glass layers, on the other hand, have a peak temperature of 830° C. or 810° C., depending on which layers. Table 2, infra, provides a representative embodiment of which glass layers heat at which temperatures.

Figure 4A:
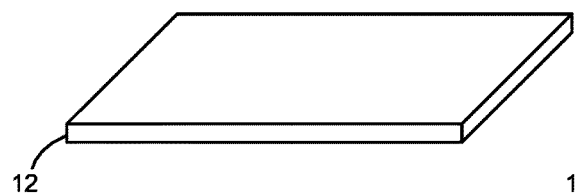
FIGS. 4A and 4B are diagrammatic views of a representative sequence of only firing a substrate with an optional layer(s) when forming an aluminum nitride heater.
Figure 4B:
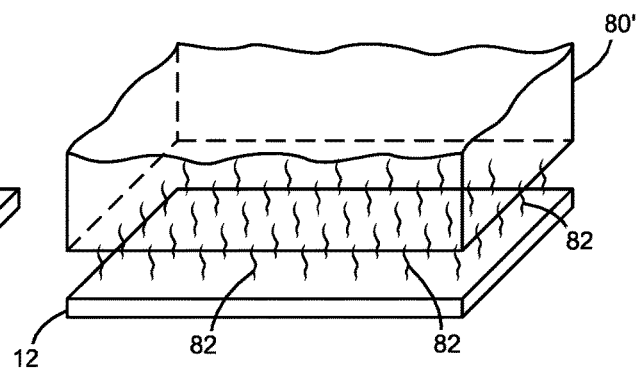

With reference to FIGS. 3A-3E, instances are shown of thick-film printing a base 12 to form and dry a layer 12 thereon. The views are similar to FIGS. 2A-2E, except there is no instance of firing the base/layer(s) in a firing unit. Rather, the processing steps only include printing and drying. Similarly, too, FIGS. 4A and 4B show the mere firing of a substrate 12 in a firing unit 80', but without any instance of printing or drying a layer on the base or substrate.

With reference to FIGS. 5A-5E, a sequence of events depicts the printing, drying and firing steps of processing, but for a patterned layer overlying a base. That is, FIG. 5A shows a base 12. In FIG. 5B, the mesh stencil 60' includes a patterned layout 61 for receiving (1) a paste 62 and leveling (2) therein by the leveling device 64, but whereas a remainder of the stencil includes a masked portion 65 preventing application of the paste 82 to the base 12. In FIG. 5C, the result is given with a base 12 having patterned layers thereon. In this instance, two longitudinally extending resistive traces 91 reside on the surface 66 of the base 12 in the pattern matching the patterned layering 61 of the stencil 60'. Of course, any patterned shapes are possible. Settling of the patterned layer then occurs for about five to ten minutes at room temperature and are similar to that of FIG. 2D. Heating of the base and patterned layers next occurs in Figure including either curing and or firing in a drying and or heating unit 80/80'. In FIG. 5E, the patterned layer of the base 12 is further shown with another patterned layer 93 representing a conductive layer connected to a resistive layer at an interface 25. Again, any patterning of layers is contemplated herein.

With the principles of any instances of printing, drying and firing on a base, reference to FIGS. 6A-6I show one embodiment of forming an aluminum nitride heater according to the invention. At FIG. 6A, an essentially pure aluminum nitride base 12 is provided. The base has 5% or fewer impurities, especially 1% or less. A surface 66 of the base is optionally pretreated by oxidizing the surface or providing a plasma treatment according to known techniques. The base is then fired according to the heating profile 102 of FIG. 8, up to a peak temperature of 850° C.

Figure 6A:
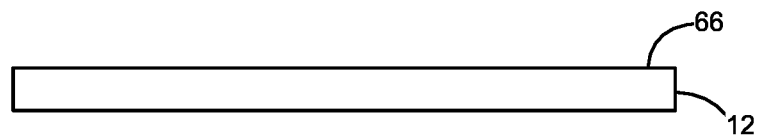
FIGS. 6A-6I are diagrammatic planar views of a representative sequence of patterning a plurality of top layers on a base forming an aluminum nitride heater.
Figure 6B:
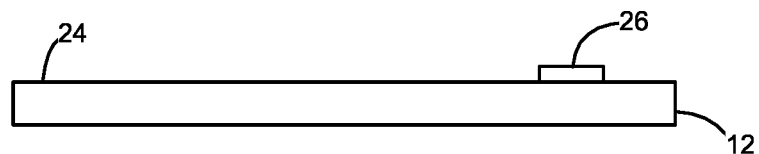
Figure 6C:
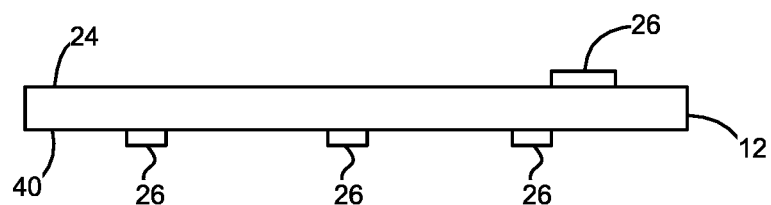

In FIG. 6B, a conductor layer 26 is patterned on a topside 24 of the base by thick-film printing and drying. The conductor layer is formed from a conductive paste. The past is a blend of silver and platinum or silver and palladium. The silver comprises more than 90% of the paste. In one design, the paste is about 93% silver and about 7% palladium. In FIG. 6C, on a backside of the base 20, another conductor layer 26 is patterned by thick-film printing and drying. The paste is the same as the topside paste and the backside is used to secure thermistors, e.g., FIG. 1C, such as by resistance-welding thermistors to the conductor layer. Thereafter, the base 12 with top and backside conductor layers are fired. The firing takes the form of the heating profile 102 of FIG. 8 and reaches a peak temperature of about 850° C. In alternate embodiments, the processes of FIGS. 6B and 6C could be reversed with the latter occurring first.

Figure 6D:
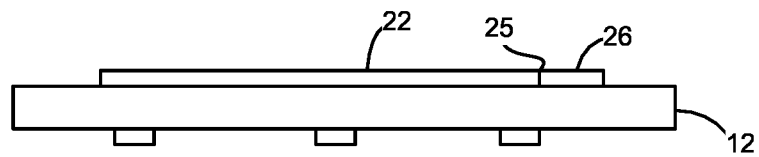

In FIG. 6D, a resistive trace 22 is patterned and connects to the conductor layer 26 at an interface 25. The trace is formed by thick-film printing with a patterned stencil and allowed to settle into place at the interface whereupon it is dried. The trace, formed also of a blend of silver and palladium, representatively comprises 80% silver and 20% palladium. Thereafter, the trace together with the base and the top and backside conductor layers is fired in a firing unit. The firing takes the form of the heating profile 102 of FIG. 8 and reaches a peak temperature of about 850° C.

Figure 6E:
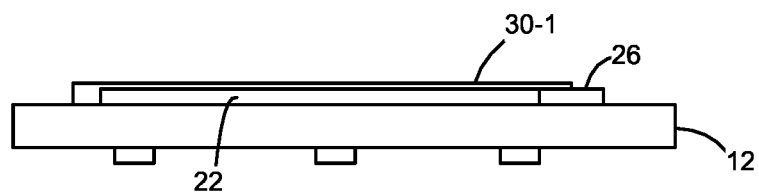
Figure 6F:
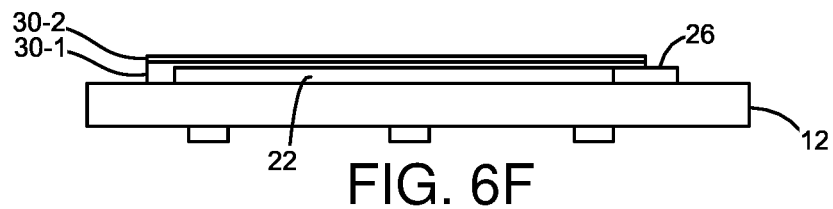

In FIG. 6E, a first glass layer 30-1 is patterned over the resistive trace and portions of the conductor. The first glass layer is patterned by thick-film printing, then dried and fired. The heating profile takes the form of the dashed line 104 in FIG. 8 and reaches a peak temperature of about 830° C. The glass layer is typified as a cross glass layer formed from a paste sold by AGC, Inc. as AP5717B14. It has thixotropic index of 1.4, a viscosity of about 61 Pa·s and a solid content of more than 70%, especially 72%. Similarly, in FIG. 6F, a second glass layer 30-2 is patterned over the first glass layer 30-1 and also covers the resistive trace and portions of the conductor. The second glass layer is patterned by thick-film printing, then dried and fired. The heating profile takes the form of the dashed line 104 in FIG. 8 and reaches a peak temperature of about 830° C. The second glass layer is also a cross glass layer formed from a paste sold by AGC, Inc. as AP5717B14.

Figure 6G:
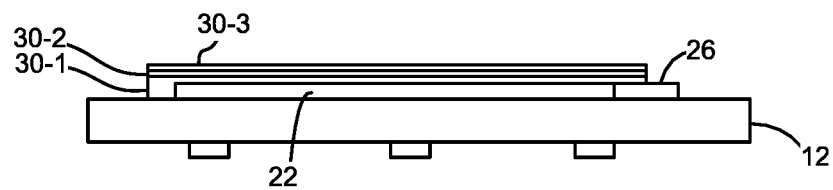
Figure 6H:
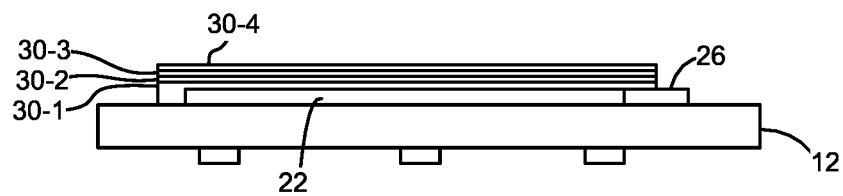

In FIG. 6G, a third first glass layer 30-3 is patterned over the second glass layer and resistive trace and portions of the conductor. The third glass layer is patterned by thick-film printing, then dried and fired. The heating profile takes the form of the dashed line 104 in FIG. 8 and reaches a peak temperature of about 830° C. The glass layer in this embodiment, however, is cover glass layer formed from a paste sold by AGC, Inc. as AP5717B13. It has thixotropic index of 1.6, a viscosity of 90 or less, about 89 Pa·s and a solid content of about 69. Similarly, in FIG. 6H, a fourth glass layer 30-4 is patterned over the third glass layer and resistive trace and portions of the conductor. The fourth glass layer is patterned by thick-film printing, then dried and fired. The heating profile takes the form of the dashed line 104 in FIG. 8 and reaches a peak temperature of about 830° C. The glass layer is cover glass layer formed from a paste sold by AGC, Inc. as AP5717B13. It too has thixotropic index of 1.6, a viscosity of 90 or less, about 89 Pa·s and a solid content of about 69.

Figure 6I:
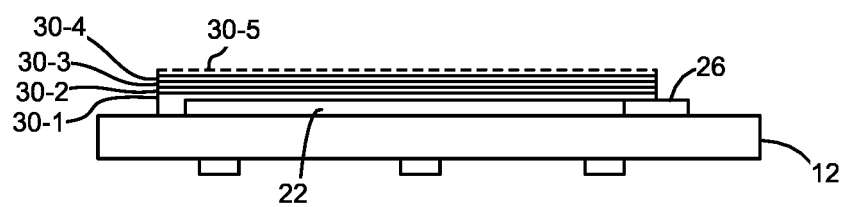

In FIG. 6I, a fifth glass layer 30-5 (optional in some embodiments, hence the dashed lines) is patterned over the fourth glass layer and resistive trace and portions of the conductor. The fifth glass layer is patterned by thick-film printing, then dried and fired. The heating profile takes a form similar to the dashed line 104 in FIG. 8, but reaches peak temperature lower than any other temperature, at around 810° C. The glass layer is cover glass layer formed from a paste sold by AGC, Inc. as AP5717B13. It has thixotropic index of 1.6, a viscosity of 90 or less, about 89 Pa·s and a solid content of about 69.

In table form, as a series of processes #1-11, Table 2 shows the making of an essentially pure aluminum nitride heater as a technical specification. Namely:

TABLE 2

| # | Process Step | Sequence | Process Temp (° C.) | Spec |
|---|---|---|---|---|
| 1 | Fire Base | F | 850 | |
| 2 | Conductor Topside | PD | | |
| 3 | Conductor Backside | PD | | |
| 4 | Fire | F | 850 | |
| 5 | Resistive trace | PDF | 850 | |
| 6 | Uniformity Checked | | | |
| 7 | COG1 | PDF | 830 | Total thickness |
| 8 | COG2 | PDF | 830 | 24 microns |
| 9 | OG1 | PDF | 830 | Total thickness |
| 10 | OG2 | PDF | 830 | 65 microns |
| 11 | OG3 | PDF | 810 | |

Notes:
1 is optional, #2 and #3 can be reversed, PD = Print, Dry, F = Fire, PDF = Print, Dry, Fire, COG1 = 1st "Cross Glass" layer, COG2 = 2nd "Cross Glass" layer, OG1 = 1st Cover Glass layer, OG2 = 2nd Cover Glass layer, OG3 = 3rd Cover Glass layer.

Thereafter, upon cooling, the resistive trace of the heater becomes tested under voltage conditions of 1.75 KVAC applied to the conductor layer. Resistance of the trace is tested cold at room temperature and upon heating the heater to about 200° C. Its resistance should be about 10 ohms at room temperature and about 11 ohms upon heating. A range of +/−2 ohms is acceptable.

The foregoing description of several structures and methods of making the same has been presented for purposes of illustration. It is not intended to be exhaustive or to limit the claims. Modifications and variations to the description are possible in accordance with the foregoing. It is intended that the scope of the invention be defined by the claims appended hereto.

The invention claimed is:

1. A method of making a heater, comprising:
on an aluminum nitride base having equal to or less than 1% impurities, firing the base before layering any layers on the base;
layering on a topside and backside of the base a conductor layer from a conductive paste and letting dry the conductor layer on each side of the base;
firing the base having the conductor layers on each side of the base;
layering a resistive layer from a resistor paste on the base such that the resistive layer connects to the conductor layer on the topside of the base and letting dry the resistive layer;

firing the base having the resistive layer and the conductor layers on each side of the base; and layering at least four layers of glass over the resistive layer, each instance of said layering the at least four layers of glass including layering a glass, drying the glass and firing the base including the glass said layered.

2. The method of claim 1, wherein the layering the glass includes layering two consecutive layers of a glass having a solid content of 65% or more and a viscosity of 100 Pa·s or less.

3. The method of claim 1, wherein each instance of firing the base for the conductor and resistive layers includes heating a heating unit having the base therein to a first peak temperature of about 850° C. and for said each instance of said firing the base including the glass heating the heating unit having the base therein to a second peak temperature of about 830° C., each instance of the heating at one of the first and second peak temperatures occurring for at least 5 minutes.

4. The method of claim 1, further including letting settle the conductor and resistive pastes before said letting dry the conductor and resistive layers, the letting settle including a period of time of about 5 to about 10 minutes at about 20° C. to about 25° C.

5. The method of claim 1, wherein each instance of said letting dry the conductor and resistive layers further includes drying in a drying unit for a period of time of about 30 total minutes at a temperature profile of the drying unit having the base therein beginning at about 25° C. and ramping up to about 80° C. for about 10 minutes, ramping up again to about 160° C. for about 10 minutes and cooling down to below 50° C.

6. The method of claim 1, further including providing a mesh stencil for each instance of said layering.

7. The method of claim 6, further including leveling through the mesh stencil the conductor and resistor pastes and the glass.

8. The method of claim 1, further including oxidizing a surface of the aluminum nitride base or plasma treating the surface before said firing the base before said layering any layers on the base.

* * * * *